United States Patent [19]

Makinouchi

[11] Patent Number: 5,777,721
[45] Date of Patent: Jul. 7, 1998

[54] EXPOSURE METHOD AND APPARATUS WITH CONTROL OF A LINEAR MOTOR

[75] Inventor: Susumu Makinouchi, Zama, Japan

[73] Assignee: Nikon Corporation, Tokyo, Japan

[21] Appl. No.: 520,245

[22] Filed: Aug. 28, 1995

[30] Foreign Application Priority Data

Mar. 8, 1995 [JP] Japan .................. 7-048310

[51] Int. Cl.$^6$ .......................................... G03B 27/42
[52] U.S. Cl. .................. 355/53; 318/640; 318/649
[58] Field of Search ................. 355/53; 318/592, 318/640, 649

[56] References Cited

U.S. PATENT DOCUMENTS

| | | | |
|---|---|---|---|
| 4,282,469 | 8/1981 | Moriyama | 318/640 X |
| 4,525,659 | 6/1985 | Imahashi et al. | 318/649 |
| 4,546,299 | 10/1985 | Veale | 318/640 X |
| 4,748,478 | 5/1988 | Suwa et al. | 355/53 |
| 4,810,941 | 3/1989 | Ohishi et al. | 318/592 X |
| 5,003,342 | 3/1991 | Nishi | 355/43 |
| 5,204,535 | 4/1993 | Mizutani | 250/548 |
| 5,214,489 | 5/1993 | Mizutani et al. | 356/363 |
| 5,243,195 | 9/1993 | Nishi | 250/548 |
| 5,446,519 | 8/1995 | Makinouchi | 355/53 |

*Primary Examiner*—Fred L. Braun
*Attorney, Agent, or Firm*—Shapiro and Shapiro

[57] ABSTRACT

A coordinate position of a stage for supporting a wafer or a reticle which is driven by a linear motor includes a stator and a mover is measured by a laser interferometer, and a thrust obtained from a deviation between the measured coordinate position and an aimed coordinate position is output to a multiplier. Further, a cosine function corresponding to a phase between the stator and the mover is obtained on the basis of the measured coordinate position and is output to the multiplier. Then, an exciting current is supplied to an armature coil of the linear motor on the basis of an output of the multiplier.

7 Claims, 2 Drawing Sheets

EXPOSURE METHOD AND APPARATUS WITH CONTROL OF A LINEAR MOTOR

BACKGROUND OF THE INVENTION

1. Field of the Invention

The present invention relates to an exposure method and apparatus which exposes a photosensitive substrate with a pattern image of a mask used in a photolithographic process for manufacturing micro devices such as a semiconductor device, liquid crystal display device, image pick-up device (CCD), thin-film magnetic head, opto-magnetic disc, etc.

2. Related Background Art

Conventionally, a projection exposure apparatus of a step-and-repeat type (stepper, or the like) which positions shot areas in an exposure field of a projection optical system successively by stepping of a wafer and collectively exposes the shot areas with a pattern image of a reticle is used as an exposure apparatus for transferring a reticle pattern serving as a mask onto a wafer (or a glass plate),on which a photosensitive material (photo-resist) is coated. In a projection exposure apparatus of this type, a driving device of a feed screw system was chiefly used as a driving device for driving a wafer stage or a reticle stage, conventionally. Recently, however, in order to improve the throughput (productivity) by reducing a positioning time and to lower an oscillation by a non-contact drive, a linear motor become used as a driving device therefor.

As an exposure apparatus for transferring a pattern image having a larger space onto a wafer without expanding the exposure field of a projection optical system, a projection exposure apparatus of a step-and-scan type which performs exposure by synchronously scanning a reticle and a wafer with respect to a projection optical system after stepping each shot area on the wafer to a scan start position is employed. The exposure apparatus of the scanning exposure type is disclosed, for example, in U.S. patent application Ser. Nos. 139,803 (Oct. 22, 1993) and 274,037 (Jul. 12, 1994). When the scanning exposure apparatus is of a reduction projection type, since it is required to scan (especially a reticle) with high speed, it is preferably to use a linear motor at least as a driving device for a reticle stage. It is also preferable to also drive a wafer stage by the linear motor in order to perform more stable scanning.

Conventionally, a linear synchronous motor of a permanent magnet type, electromagnet type, or the like, is used as a linear motor for driving a reticle stage or a wafer stage of an exposure apparatus. This linear synchronous motor basically consists of an armature coil on the primary side and a field magnet on the secondary side, and is arranged such that a mover side is moved by a moving magnetic field which is generated in said armature coil. In this case, it is required to detect the position of the field magnet on the secondary side in order to correctly determine the phase of the moving magnetic field generated in said armature coil (in order to conduct phase switch correctly). Then, in the conventional exposure apparatus, the linear synchronous motor is provided with a phase switching sensor (consisting of a magnetic sensor of a Hall element type) for detecting a positional relation of the polarity of the field magnet with respect to the standing armature coil. In the exposure apparatus, there is also provided a coordinate measuring device (laser interferometer, or the like) for detecting the position of a stage. However, the coordinate measuring device is provided in parallel to the phase switching sensor in the conventional exposure apparatus.

As described above, when the linear motor is used as the driving device for driving the stage in the conventional exposure apparatus, the phase switching sensor is provided separately from the coordinate measuring device for the stage. This phase switching sensor is required to be disposed, for example, periodically, on the entire range in which the field magnet moves, which results in an inconveniently complicated mechanism and wiring of the stage.

Since, generally, various mechanisms such as an alignment sensor, a focal position detecting system for autofocusing, and a loader system, for a reticle or a wafer, are incorporated in an exposure apparatus, it is desired to constitute a driving mechanism for the stage as simple as possible and to secure a space around the stage as wide as possible.

SUMMARY OF THE INVENTION

An object of the present invention is, in an exposure apparatus using a linear motor as a driving device for driving a stage, to drive said linear motor without using a special phase switching sensor.

A first exposure apparatus according to the present invention comprises a mask stage for positioning a mask, a linear motor for driving said mask stage, and a position detection system for detecting the position of said mask stage, and uses an output signal from the position detection system as phase control information for said linear motor.

A second exposure apparatus according to the present invention comprises a substrate stage for positioning a photosensitive substrate, a linear motor for driving said substrate stage, and a position detection system for detecting the position of said substrate stage, and uses an output signal from the position detection system as phase control information for said linear motor.

In the first and second exposure apparatuses, said position detection system is, for example, a laser interferometer.

According to the first and second exposure apparatuses of the present invention, the linear motor, such as a linear synchronous motor, is used as a driving device for driving the mask or the photosensitive substrate, and the position detecting system of the stage is used as the phase switching sensor for detecting the position of the field magnet of the linear synchronous motor. Specifically, a positional relation between the armature coil and the field magnet of the linear motor for driving said stage is detected on the basis of an output (a result of measurement) of the position detection system of the stage. For example, when the field magnet and the armature coil of said linear synchronous motor are in a predetermined positional relation, a measured value by said position detection system is reset (or preset), and thereafter the measured value by said position detection system is divided by an alignment pitch of the field magnet to obtain a remainder, whereby the positional relation (phase) between said field magnet and said armature coil can be obtained. Accordingly, said linear motor can be driven without provision of another switching sensor. As a result, the manufacturing cost can be reduced, the stage mechanism can be simplified, and other mechanisms can be loaded easily.

In addition, when the laser interferometer is used as the position detection system, the position of the stage can be detected without contact at a high precision, and the phase control between the armature coil and the field magnet of the linear motor can be performed with very high resolving power and a high precision.

DESCRIPTION OF THE PREFERRED EMBODIMENT

An embodiment of an exposure apparatus according to the present invention will be described with reference to the drawings. In the embodiment, the present invention is applied to a reduction projection exposure apparatus of the step-and repeat type (stepper) which exposes each shot area on a wafer by a reduced image of a pattern of a reticle.

Figure 1:
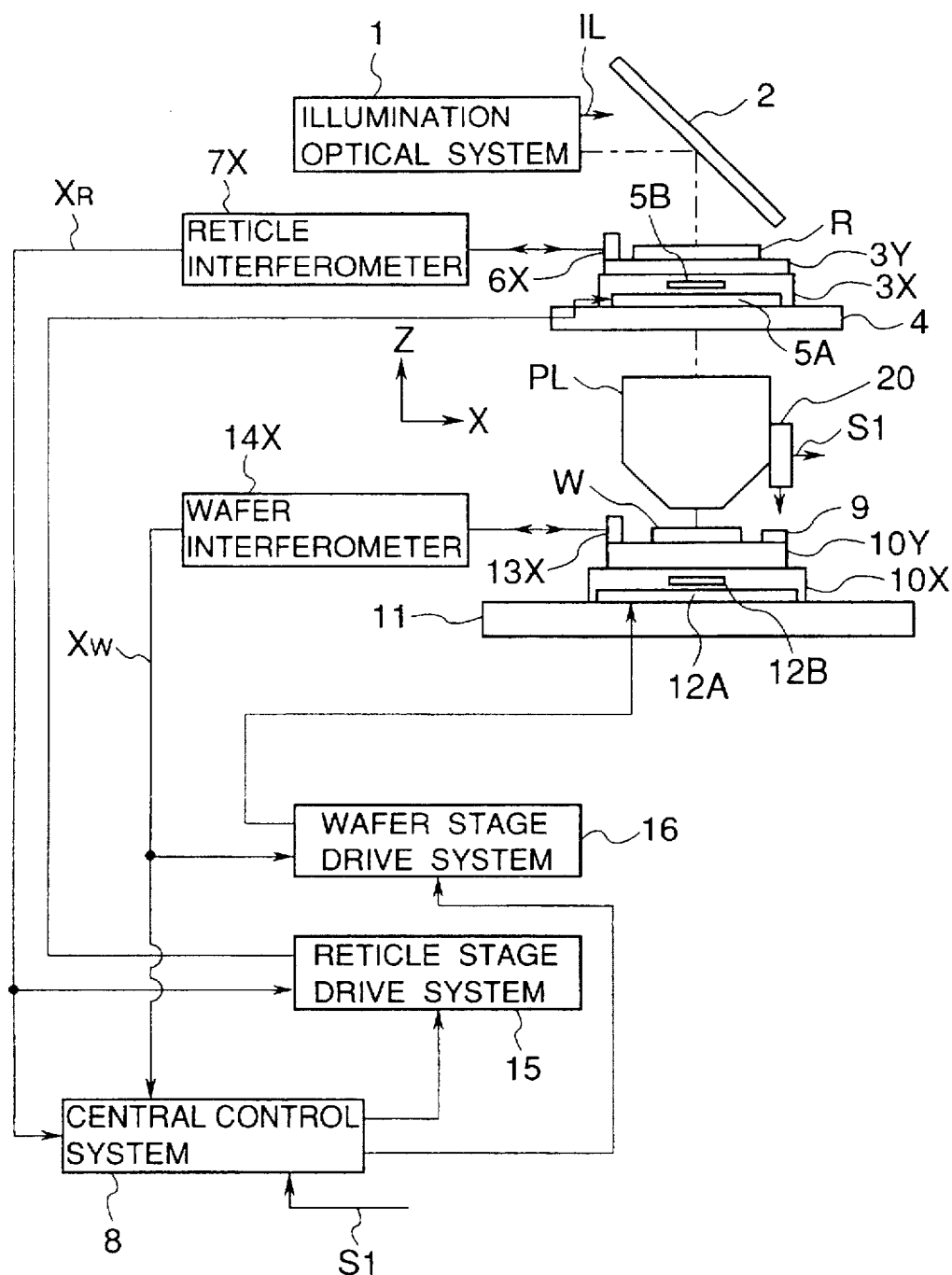
FIG. 1 is a schematic structural view showing a projection exposure apparatus according to an embodiment of the present invention.

FIG. 1 shows a schematic structure of the projection exposure apparatus according to the present embodiment. Referring to FIG. 1, an exposure light (such as an i beam, excimer laser, or the like) IL emitted from an illumination optical system 1 is reflected by a dichroic mirror 2, and illuminates a pattern region of a reticle R with substantially uniform intensity of illumination. The Z axis is set to parallel to a main optical line of the exposure light IL reflected by the dichroic mirror 2 (the optical axis of the projection optical system PL), the X axis is set in the direction parallel to the sheet surface of FIG. 1 within the two-dimensional plane perpendicular to Z axis, and the Y axis is set in the direction perpendicular to the sheet surface of FIG. 1.

The reticle R is mounted on a Y stage 3Y which is movable in the Y direction, and the Y stage 3Y is mounted on an X stage 3X which is movable in the X direction on a base 4. The X stage 3X is driven in the X direction by a linear motor which consists of a stator 5A and a mover 5B (hereinafter called the reticle X-stage linear motor) with respect to the base 4, and the Y stage 3Y is driven in the Y direction by a linear motor (not shown) having the same structure as the reticle X-stage linear motor with respect to the X stage 3X. In the following, a stage system which comprises the Y stage 3Y, the linear motor for driving said Y stage 3Y, X stage 3X, and the reticle X-stage linear motor for driving said X stage 3X is called a reticle stage. Though the reticle stage in this embodiment has a structure in which the X stage 3X and the Y stage 3Y are layered, said reticle stage may have a structure in which reticles are moved in the X direction and the Y direction, respectively, on a base, as disclosed in the U.S. patent application Ser. No. 266,999 (Jun. 27, 1994).

On the Y stage 3Y, a moving mirror 6X for the X axis and a moving mirror (not shown) for the Y axis are fixed, and an X coordinate $X_R$ of the X stage 3X is measured by the moving mirror 6X and a laser interferometer 7X for the X axis. Though not shown in the drawing, a laser interferometer for the Y axis for applying a laser beam onto the moving mirror for the Y axis is also provided. The Y coordinate of the Y stage 3Y is measured by said moving mirror and the laser interferometer for the Y axis. A specific configuration of this interferometer system is disclosed in the U.S. patent application Ser. No. 943,808 (Dec. 19, 1986), or the U.S. Pat. No. 4,748,478. The X coordinate $X_R$ and the Y coordinate measured by the laser interferometers for the X axis and the Y axis (hereinafter called the reticle interferometers) are supplied to a central control system 8 which controls the whole operation of the apparatus.

The exposure light IL passing through the reticle R enters the projection optical system PL having a projection magnification β (for example, β=⅕), and this projection optical system PL reduces the pattern image of the reticle R to project it onto one shot area on a wafer W. The wafer W is mounted on the Y stage 10Y which is movable in the Y direction, and this Y stage 10Y is mounted on the X stage 10X which is movable in the X direction on a base 11. The X stage 10X is driven in the X direction by a linear motor which consists of a stator 12A and a mover 12B (hereinafter called the wafer X-stage linear motor) with respect to the base 11, and the Y stage 10Y is driven in the Y direction by a linear motor (not shown) having the same structure as the wafer X-stage linear motor with respect to the X stage 10X. In the following, a stage system which comprises the Y stage 10Y, the linear motor for driving said Y stage 10Y, X stage 10X, the wafer X-stage linear motor for driving said X stage 10X, and a Z-leveling stage (not shown) for regulating a position and an angle of inclination of the wafer W in the Z direction is called a wafer stage. Though the wafer stage in this embodiment has a structure in which the X stage 10X and the Y stage 10Y are layered, said wafer stage may have a structure in which wafers are moved in the X direction and the Y direction, respectively, on a base, as disclosed in the U.S. patent application Ser. No. 221,375 (Apr. 1, 1994).

On the Y stage 10Y, a moving mirror 13X having a reflection plane extending along the Y direction for the X axis and a moving mirror (not shown) having a reflection plane extending along the X direction for the Y axis are fixed, and an X coordinate $X_W$ of the X stage 10X is measured by a laser interferometer 14X for the X axis for applying a laser beam onto the moving mirror 13 along the X direction. Though not shown in the drawing, a laser interferometer for the Y axis for applying a laser beam onto the moving mirror for the Y axis along the Y direction is also provided. A Y coordinate of the Y stage 10Y is measured by said laser interferometer for the Y axis. A specific configuration of this interferometer system is disclosed, for example, in the U.S. Pat. Nos. 5,003,342 and 5,243,195. The X coordinate $X_W$ and the Y coordinate measured by the laser interferometers for the X axis and the Y axis (hereinafter called the wafer interferometers) are supplied to the central control system 8.

The central control system 8 determines the position of the reticle R by controlling an operation of the linear motors for the X axis and the Y axis on the reticle side, respectively, through a reticle stage drive system 15, and also determines the position of the wafer W by controlling an operation of the linear motors for the X axis and the Y axis on the wafer side, respectively, through a wafer stage drive system 16.

In the present embodiment, a reference mark member 9 is fixed onto the Y stage 10Y in such a manner that the surface of said member has the same height as that of the surface of the wafer W. A reference mark which takes, for example, a cross shape is formed on the surface of this reference mark member 9. This reference mark is normally used for detection of a distance (base line) between the detection center of an alignment sensor and an exposure center, for positioning the reticle R with respect to the wafer stage (reticle alignment) and for detecting the position of a wafer mark (alignment mark) provided in each shot area of the wafer W. Furthermore, in the present embodiment, the reference mark on the reference mark member 9 is used as a reference for the position of the field magnet of the linear motor.

As the above-mentioned alignment sensor, an alignment sensor 20 of an off-axis type and an image pick-up type is provided separately from the projection optical system PL in this embodiment. Inside this alignment sensor 20, a predetermined index mark is arranged at a position conjugated with the surface of the reference mark member 9 (or the wafer W), the image of a mark to be measured and the image of said index mark are simultaneously picked up by an image pick-up device, and an image pick-up signal S1 therefrom is supplied to the central control system 8. The central control system 8 processes said image pick-up signal S1 to obtain an amount of positional displacement of the mark to be measured with respect to said index mark. Specific configurations of the alignment sensor 20 and the reference mark member 9 are disclosed, for example, in the U.S. Pat. No. 5,243,195. Though not shown in the drawing, above the dichroic mirror 2, there is also provided an alignment sensor of a TTR (Through The Reticle) type for detecting a positional relation between the reticle R and each shot area on the wafer W, as disclosed, for example, in the U.S. Pat. No. 5,214,489 or U.S. Pat. No. 5,204,535.

Next, configurations and operations of the linear motor and the control systems thereof in the present embodiment will be described below with reference to the X stage 10X which constitutes the wafer stage in FIG. 1.

Figure 2:
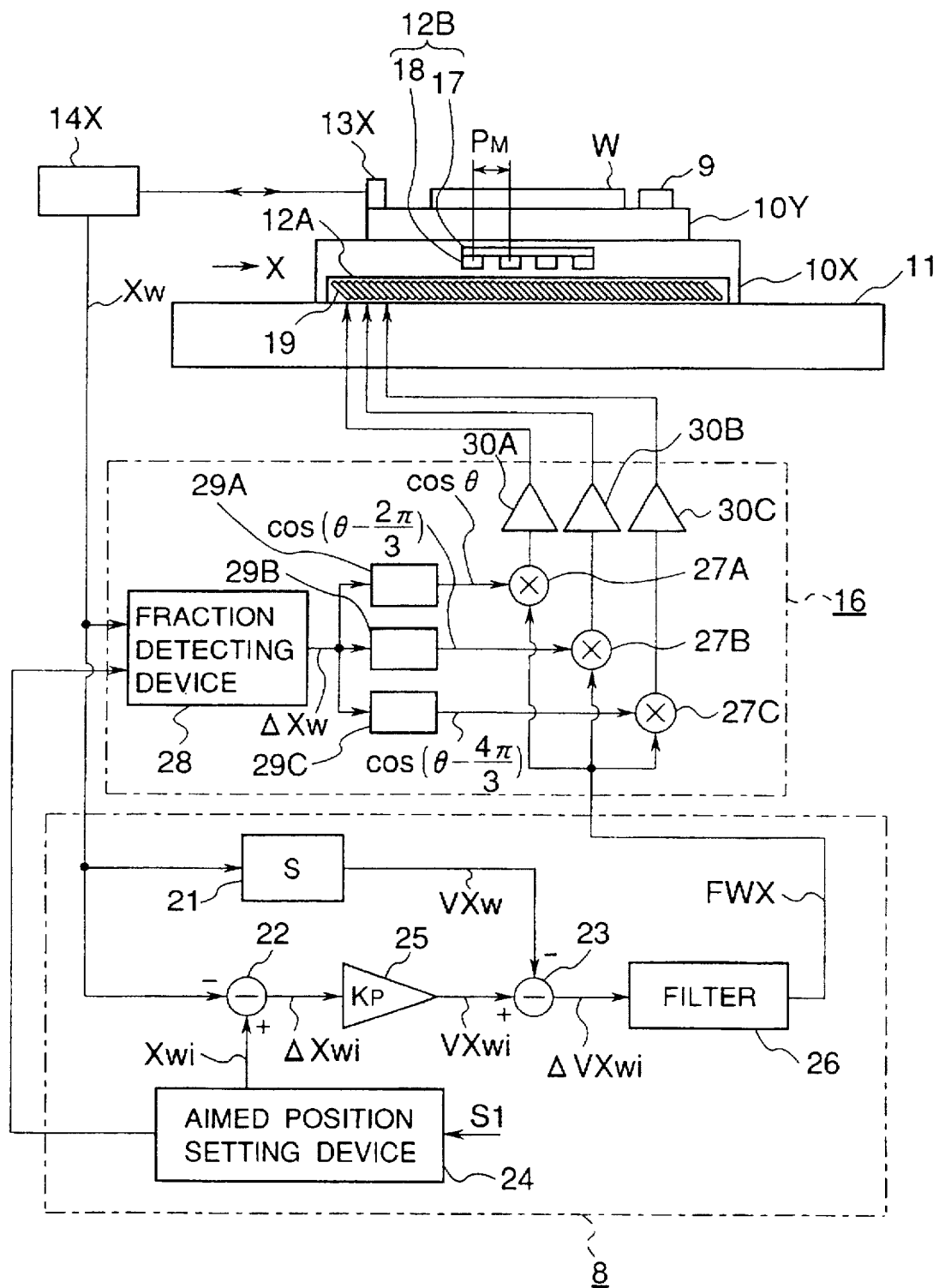
FIG. 2 is a structural view showing a part of the wafer stage in FIG. 1 and the control system thereof.

FIG. 2 is a structural view of the wafer stage shown in FIG. 1 and the control system thereof. Referring to FIG. 2, the stator 12A of wafer X-stage linear motor is constituted by loading a 3-phase armature coil 19 within a predetermined cover, and the mover 12B is constituted by fixing four permanent magnets 18 on the bottom of a flat-plate (back yoke) 17 which is fixed on the side of the X stage 10X in such a manner that the polarities thereof are successively inverted at a polar pitch $P_M$ in the X direction. That is, the wafer X-stage linear motor 12 in the present embodiment is a linear synchronous motor of a moving magnet type, and has a simple structure so that a probability of break down is low and the maintenance thereof is easy. However, a linear motor of a moving coil type which contains an armature coil on the mover side may be used.

Next, in the central control system 8 of the present embodiment constituted by computers, the X coordinate $X_W$ of the X stage 10X which is measured by the wafer interferometer 14X for the X axis is supplied to an input unit of a differentiator 21 and an input unit on a subtraction side of a subtracter 22. The differentiator 21 differentiates the supplied X coordinate $X_W$ by time to calculate a velocity $VX_W$ of the X stage in the X direction, and supplies this velocity $VX_W$ to an input unit on a subtraction side of a subtracter 23. Since the differentiator 21 and the like in the central control system 8 are functions to be executed on software of a computer, a differentiating operation thereof is executed from, for example, a subtracting operation and a dividing operation for dividing a difference obtained from said subtracting operation by a sampling period.

On the other hand, an aimed coordinate $X_{Wi}$ for positioning the X stage 10X in the X direction is supplied from an aimed position setting device 24 to an addition side of the subtracter 22. The subtracter 22 subtracts the current X coordinate $X_W$ of the X stage 10X from the aimed coordinate $X_{Wi}$ so as to obtain a positional deviation $\Delta X_{Wi}$ (=$X_{Wi}$–$X_W$), and supplies this positional deviation $\Delta X_{Wi}$ to an input unit of a positional gain circuit 25. The positional gain circuit 25 obtains an aimed driving velocity $VX_{Wi}$ by multiplying the positional deviation $\Delta X_{Wi}$ by a coefficient $K_P$ for obtaining a velocity corresponding to each positional deviation, and supplies this aimed driving velocity $VX_{Wi}$ to an input unit on an addition side of the subtracter 23. The subtracter 23 subtracts the measured velocity $VX_W$ of the X stage 10X from the aimed driving velocity $VX_{Wi}$ to obtain the velocity deviation $\Delta VX_{Wi}$ in the X direction, and supplied this velocity deviation $\Delta VX_{Wi}$ to a filter circuit 26. The filter circuit 26 operates, for example, as a low-pass filter, obtains a value for a thrust FWX in the X direction corresponding to a low-frequency component of the supplied velocity deviation $\Delta VX_{Wi}$, and supplies the value for this thrust FWX to one of two input units of each of three multipliers 27A to 27C in the wafer stage drive system 16.

Also, the image pick-up signal S1 from the alignment sensor 20 of FIG. 1 is supplied to the aimed position setting device 24 in the central control system 8. In this case, a phase $\theta_0$[rad] of the permanent magnet 18 with respect to the armature coil 19 in FIG. 2 when the image of the reference mark on the reference mark member 9 is coincident with the index mark in the alignment sensor 20 is obtained, and a value obtaining by converting said phase $\theta_0$ into an amount of positional displacement $\Delta X_0$ (=$P_M \cdot \theta_0/(2\pi)$) in the X direction by use of the polar pitch $P_M$ of the permanent magnet 18 is stored in a memory inside the aimed position setting device 24. Then, when the reference mark of the reference mark member 9 is moved into an observation field of view of the alignment sensor 20 at the initial setting, the aimed position setting device 24 processes said image pick-up signal S1 to obtain an amount of positional displacement (converted value on the wafer W) $\Delta X_1$ of an image of said reference mark with respect to the index mark in the X direction. Thereafter, the aimed position setting device 24 supplies an amount of positional displacement ($\Delta X_0 + \Delta X_1$) which is obtained by adding said amount of positional displacement $\Delta X_1$ and the amount of positional displacement $\Delta X_0$ stored in advance to a fraction detecting device 28 inside the wafer stage drive system 16.

Wafer stage drive system 16 is constituted by computers except power amplifiers 30A to 30C. In this wafer stage drive system 16, the X coordinate $X_W$ of the X stage 10X measured by the wafer interferometer 14X is supplied to the fraction detecting device 28. The amount of positional displacement ($\Delta X_0 + \Delta X_1$) from the aimed position setting device 24 is supplied to the fraction detecting device 28 at the initial setting. This amount of positional displacement ($\Delta X_0 + \Delta X_1$) represents an amount of positional displacement of the permanent magnet 18 with respect to the armature coil 19 at the initial setting.

Then, the fraction detecting device 28 determines an offset value $X_{OFF}$ such that a coordinate obtained by adding said offset value $X_{OFF}$ to a value $X_{WO}$ of the X coordinate $X_W$ of the X stage 10X at that time turns to be said amount of positional displacement ($\Delta X_0 + \Delta X_1$). That is, the following relation is established:

$$X_{OFF} = (\Delta X_0 + \Delta X_1) - X_{WO} \quad (1)$$

Then, after the initial setting, the fraction detecting device 28 obtains a fraction $\Delta X_W$ by dividing a coordinate which is obtained by adding the offset value $X_{OFF}$ to the X coordinate $X_W$ supplied from the wafer interferometer 14X by double the polar pitch $P_M$ ($2 \times P_M$) of the permanent magnet 18 of the stator 12B, and supplies this fraction $\Delta X_W$ to three phase converting devices 29A to 29C. In response to this, the first phase converting device 29A generates a value for $\cos\theta$ where $\theta$ is a phase obtained by multiplying $2\pi$ by a value which is obtained by dividing the fraction $\Delta X_W$ by double the polar pitch $P_M$ ($2 \times P_M$), and supplies this value for $\cos\theta$ to the other input unit of the first multiplier 27A. The second phase converting device 29B shifts said phase $\theta$ by $2\pi/3$ to generate a value for $\cos(\theta - 2\pi/3)$, and supplies this value for $\cos(\theta - 2\pi/3)$ to the other input unit of the second multiplier 27B. In the same manner, the third phase converting device 29C shifts the phase $\theta$ by $4\pi/3$ to generate a value for $\cos(\theta - 4\pi/3)$, and supplies this value for $\cos(\theta - 4\pi/3)$ to the other input unit of the third multiplier 27C.

Then, the first multiplier 27A supplies a current signal corresponding to a thrust which is obtained by multiplying the thrust FWX supplied from the filter circuit 26 by $\cos\theta$ to a power amplifier 30A. The second multiplier 27B supplies a current signal corresponding to a thrust which is obtained by multiplying said thrust FWX by $\cos(\theta-2\pi/3)$ to a power amplifier 30B, and the third multiplier 27C supplies a current signal corresponding to a thrust which is obtained by multiplying said thrust FWX by $\cos(\theta-4\pi/3)$ to a power amplifier 30C. Each of the power amplifiers 30A, 30B and 30C amplifies the supplied current signal and supplies an exciting current to a coil of a corresponding phase of the 3-phase armature coil 19. Thus, the X stage 10X is driven to the X direction through the wafer X-stage linear motor until the X coordinate of the X stage 10X is convergent on the aimed coordinate set by the aimed position setting device 24.

As described above, in the present embodiment, an amount of positional displacement (phase) of the permanent magnet 18 with respect to the armature coil 19 is calculated in the fraction detecting device 28 on the basis of the X coordinate $X_w$ supplied from the wafer interferometer 14X, and a phase of the exciting current supplied to the coil of each phase of the armature coil 19 by a servo system is set on the basis of said amount of positional displacement. Therefore, it is no longer required to separately provide a phase switching sensor (consisting of a Hall element, etc.) for detecting the polarity of the permanent magnet 18. As a result, the stage mechanism can be simplified and various kinds of mechanisms can be easily provided on the stage.

In the above-described embodiment, the reference mark member 9 on the Y stage 10Y is used for obtaining the measured value (X coordinate) of the wafer interferometer 14X and the correspondence of the armature coil with the phase of the magnet in the linear motor. However, in addition to this, said correspondence may be obtained, for example, by use of a limit switch, or the like, for setting an origin of the wafer interferometer 14X.

The present invention is applicable not only to the exposure apparatus (stepper, etc.) of the step-and-repeat type, but also to the scan exposure apparatus of the step-and-scan type disclosed in the U.S. patent application Ser. Nos. 139,803 (Oct. 22, 1993) and 274,037 (Jul. 12, 1994), in which apparatus the linear motor is used as a driving device for driving the reticle stage or the wafer stage. As seen from the above description, the present invention is not limited to the foregoing embodiment, but can take various structures within the scope of the present invention.

What is claimed is:

1. A method for driving a stage for supporting a mask or a photosensitive substrate, comprising the steps of:
    detecting the position of said stage to obtain phase information of a coil and a magnet of a linear motor for driving said stage based on said detected position; and
    controlling an exciting current of said coil according to said phase information.

2. A method according to claim 1, further comprising the step:
    exposing said photosensitive substrate with an image of a pattern on said mask.

3. A method according to claim 1, further comprising:
    detecting a predetermined stage position; and
    determining an offset value based on the detected predetermined stage position, wherein
    said controlling is based on said phase information and said offset value.

4. A method according to claim 1, wherein said magnet includes a plurality of permanent magnet portions and said coil is a multi-phase armature coil that cooperates with said plurality of permanent magnet portions, and further comprising:
    controlling an exciting current in each phase of said multi-phase coil according to said phase information.

5. A method according to claim 4, further comprising:
    arranging said plurality of permanent magnet portions to have alternating polarities in a driving direction.

6. An exposure method comprising the steps:
    detecting the position of a stage for supporting a mask or a photosensitive substrate; and
    driving said stage by using said detected position as phase control information of a linear motor for driving said stage in order to expose said photosensitive substrate by an image of a pattern on said mask.

7. A method according to claim 6, further comprising:
    detecting a predetermined stage position; and
    determining an offset value based on the detected predetermined stage position, wherein
    said driving in based on said phase information and said offset value.

* * * * *